(12) United States Patent
Wang et al.

(10) Patent No.: US 9,263,686 B2
(45) Date of Patent: Feb. 16, 2016

(54) METHOD OF MANUFACTURING ORGANIC THIN FILM TRANSISTOR HAVING ORGANIC POLYMER INSULATING LAYER

(71) Applicant: BOE TECHNOLOGY GROUP CO., LTD., Beijing (CN)

(72) Inventors: Xianghua Wang, Beijing (CN); Xianfeng Xiong, Beijing (CN); Ze Liu, Beijing (CN); Longzhen Qiu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/354,755

(22) PCT Filed: Nov. 29, 2013

(86) PCT No.: PCT/CN2013/088130
§ 371 (c)(1),
(2) Date: Apr. 28, 2014

(87) PCT Pub. No.: WO2014/183418
PCT Pub. Date: Nov. 20, 2014

(65) Prior Publication Data
US 2015/0001513 A1   Jan. 1, 2015

(30) Foreign Application Priority Data

May 16, 2013   (CN) .......................... 2013 1 0181851

(51) Int. Cl.
*H01L 51/05*   (2006.01)
*H01L 51/00*   (2006.01)
*H01L 51/10*   (2006.01)

(52) U.S. Cl.
CPC ........ *H01L 51/0533* (2013.01); *H01L 51/0005* (2013.01); *H01L 51/0529* (2013.01); *H01L 51/0545* (2013.01); *H01L 51/105* (2013.01)

(58) Field of Classification Search
CPC .................................................... H01L 51/0533
See application file for complete search history.

(56) References Cited

U.S. PATENT DOCUMENTS

2005/0001210 A1   1/2005   Lee et al.
2005/0285102 A1   12/2005  Koo et al.
(Continued)

FOREIGN PATENT DOCUMENTS

CN   1577912 A   2/2005
CN   1713409 A   12/2005
(Continued)

OTHER PUBLICATIONS

International Search Report for International Application No. PCT/CN2013/088130, 14pgs.
(Continued)

*Primary Examiner* — Michael Jung
(74) *Attorney, Agent, or Firm* — Ladas & Parry LLP

(57) ABSTRACT

An organic thin film transistor and a manufacturing method thereof are provided. The organic thin film transistor comprises: a substrate; a gate electrode layer (21) and a source/drain electrode layer (24), formed on the substrate; an organic semiconductor layer (25), formed between source and drain electrodes (24) of the source/drain electrode layer; and an organic insulating layer (23), formed between the gate electrode layer (21) and the organic semiconductor layer (25) and made from an organic polymer material.

7 Claims, 4 Drawing Sheets

(56) References Cited

U.S. PATENT DOCUMENTS

| | | | |
|---|---|---|---|
| 2009/0278117 A1* | 11/2009 | Lim et al. .................... | 257/40 |
| 2010/0032660 A1 | 2/2010 | Nomoto et al. | |
| 2010/0102299 A1 | 4/2010 | Murase et al. | |
| 2010/0176379 A1 | 7/2010 | Kim et al. | |
| 2011/0136992 A1* | 6/2011 | Yahagi .................... | 525/474 |
| 2011/0284849 A1* | 11/2011 | Marks et al. .................... | 257/57 |
| 2012/0142515 A1* | 6/2012 | Wu et al. .................... | 501/32 |
| 2013/0126860 A1* | 5/2013 | Fukuda et al. .................... | 257/43 |
| 2014/0098320 A1 | 4/2014 | Zhang et al. | |

FOREIGN PATENT DOCUMENTS

| | | |
|---|---|---|
| CN | 101542744 A | 9/2009 |
| CN | 101589482 A | 11/2009 |
| CN | 101645488 A | 2/2010 |
| CN | 102902095 A | 4/2013 |
| CN | 103325943 A | 9/2013 |
| KR | 2006-0021530 | 3/2006 |

OTHER PUBLICATIONS

International Search Report for International Application No. PCT/CN2013/074374, 13pgs.
First Chinese Office Action dated Apr. 30, 2015; Appln. No. 201310181851.6.
Second Chinese Office Action Appln. No. 201310181851.6; Dated Nov. 4, 2015.
International Preliminary Report on Patentability Appln. No. PCT/CN2013/088130; Dated Nov. 17, 2015.

* cited by examiner

METHOD OF MANUFACTURING ORGANIC THIN FILM TRANSISTOR HAVING ORGANIC POLYMER INSULATING LAYER

CROSS REFERENCE TO RELATED APPLICATIONS

This application is based on International Application No. PCT/CN2013/088130 filed on Nov. 29, 2013, which claims priority to Chinese National Application No. 201310181851.6 filed on May 16, 2013. The entire contents of each and every foregoing application are incorporated herein by reference.

TECHNICAL FIELD

Embodiments of the present invention relate to an organic thin film transistor and a manufacturing method thereof.

BACKGROUND

An organic thin film transistor (OTFT) is a semiconductor device produced by replacing a conventional inorganic material with an organic material. Compared to a transistor made from an inorganic material, OTFT has more and newer film forming technologies, so that the production process is simple, diversity and low cost, and the manufactured transistor is more flexible.

Silicon oxide is a very important insulating material in silicon-based semiconductor devices and its preparation process is mature, and thus, in an existing configuration of the organic thin film transistor illustrated in FIG. 1, silicon oxide is usually used as an insulating layer 12 on a gate electrode layer 11, afterwards, a source/drain electrode layer 13 is fabricated on the insulating layer 12, and an organic semiconductor material is printed on the source/drain electrode layer 13 to form an organic semiconductor layer 14.

As regards existing processes for fabricating organic thin film transistors by inkjet printing, the majority of them are to print an organic semiconductor ink material on a silicon oxide substrate directly. As the crystallization property of the organic semiconductor material is different between a surface of silicon oxide and a surface of metal electrode, it leads to a discontinuity of an organic semiconductor thin film on the boundary of a channel. Thus, the need of printing a continual organic semiconductor thin film across the channel cannot be satisfied, and eventually, continuity of the organic semiconductor thin film will be destroyed, and the crystal configuration of the organic semiconductor thin film will be uncontrollable. Furthermore, from the point of view of device performance, in case that the organic semiconductor material is directly printed on the silicon oxide substrate, an obvious hysteresis phenomenon presents in its transmission characteristic.

SUMMARY

According to an embodiment of the present invention, there is provided an organic thin film transistor, comprising:
a substrate;
a gate electrode layer and a source/drain electrode layer, formed on the substrate;
an organic semiconductor layer, formed between source and drain electrodes of the source/drain electrode layer; and
an organic insulating layer, formed between the gate electrode layer and the organic semiconductor layer and made from an organic polymer material.

In an example, between the gate electrode layer and the organic semiconductor layer, there is further formed an inorganic insulating layer, and the organic insulating layer is located between the inorganic insulating layer and the organic semiconductor layer.

In an example, at least a part of the organic semiconductor layer directly contacts the organic insulating layer.

In an example, at least the part of the organic semiconductor layer configured for forming a channel directly contacts the organic insulating layer.

In an example, the organic polymer material is generated by cross-linking reaction of poly(4-vinyl phenol) with methylated poly(melamine-co-formaldehyde), and the organic polymer material has a repetitive unit of methylated poly(melamine-co-formaldehyde) cross-linked with poly(4-vinyl phenol) as illustrated in formula (I):

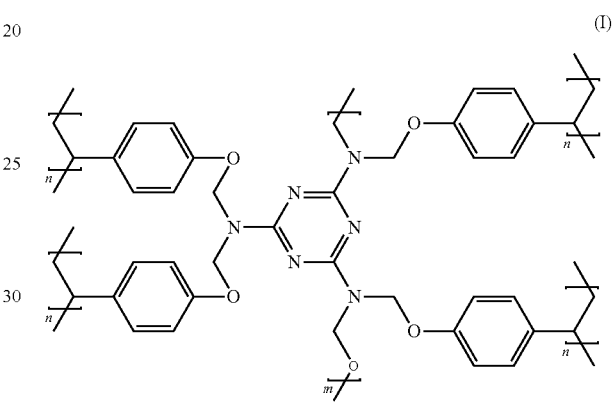

(I)

In an example, a sum of masses of poly(4-vinyl phenol) and methylated poly(melamine-co-formaldehyde) in the organic polymer material takes a percentage ranging from 5% to 15% in a total mass, and a mass ratio of poly(4-vinyl phenol) to methylated poly(melamine-co-formaldehyde) is less than 5 and greater than 1.

According to another embodiment of the invention, there is provided a method of manufacturing an organic thin film transistor, comprising:
forming an organic insulating layer made from an organic polymer material on a substrate on which a gate electrode layer is formed;
forming a source/drain electrode layer and an organic semiconductor layer on the substrate on which the organic insulating layer is formed.

In an example, forming the organic insulating layer made from the organic polymer material on the substrate on which the gate electrode layer is formed comprises:
preparing a solution of the organic polymer material;
coating the prepared solution of the organic polymer material on the substrate on which the gate electrode layer is formed, so as to form the organic insulating layer; or
forming an inorganic insulating layer on the substrate on which the gate electrode layer is formed;
preparing a solution of the organic polymer solution;
coating the prepared solution of the organic polymer solution on the substrate on which the gate electrode layer and the inorganic insulating layer are formed, so as to form the organic insulating layer.

In an example, preparing the solution of the organic polymer material comprises:

dissolving poly(4-vinyl phenol) and methylated poly(melamine-co-formaldehyde) in propylene glycol monomethyl ether acetate, so as to prepare the solution of the organic polymer material by mixing;

coating the prepared solution of the organic polymer material to form the organic insulating layer comprises:

allowing poly(4-vinyl phenol) and methylated poly(melamine-co-formaldehyde) to undergo an organic cross-linking reaction under heating condition, so as to form the organic insulating layer.

In an example, poly(4-vinyl phenol) and methylated poly(melamine-co-formaldehyde) undergo a cross-linking reaction to generate an organic macromolecular polymer, which has a repetitive unit of methylated poly(melamine-co-formaldehyde) cross-linked with poly(4-vinyl phenol) as illustrated in formula (I):

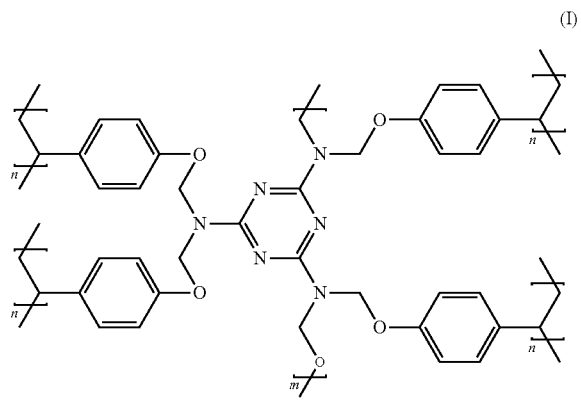

(I)

In an example, a sum of masses of poly(4-vinyl phenol) and methylated poly(melamine-co-formaldehyde) in the solution takes a percentage ranging from 5% to 15% in a total mass of the solution, and a mass ratio of poly(4-vinyl phenol) to methylated poly(melamine-co-formaldehyde) is less than 5 and greater than 1.

In an example, the solution is made by mixing poly(4-vinyl phenol), methylated poly(melamine-co-formaldehyde) and propylene glycol monomethyl ether acetate in a mass ratio of 6:4:90.

In an example, the prepared solution of the organic polymer material is coated on the substrate on which the gate electrode layer is formed or on the substrate on which the gate electrode layer and the inorganic insulating layer are formed by way of a low speed spin-coating followed by a high speed spin-coating.

In an example, the low speed spin-coating is a spin-coating at a speed of 800 revolutions per minute, and the high speed spin-coating is a spin-coating at a speed of 4000 revolutions per minute.

In an example, after the prepared solution of the organic polymer material is coated on the substrate on which the gate electrode layer is formed or on the substrate on which the gate electrode layer and the inorganic insulating layer are formed, the substrate on which the solution of the organic polymer material is coated is placed in a vacuum drying box for thermal treatment, so that poly(4-vinyl phenol) and methylated poly(melamine-co-formaldehyde) undergo an organic cross-linking reaction under heating condition to form the organic insulating layer.

In an example, the substrate coated with the solution of the organic polymer material is placed in the vacuum drying box at a heating temperature of 180° C.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

Figure 1:
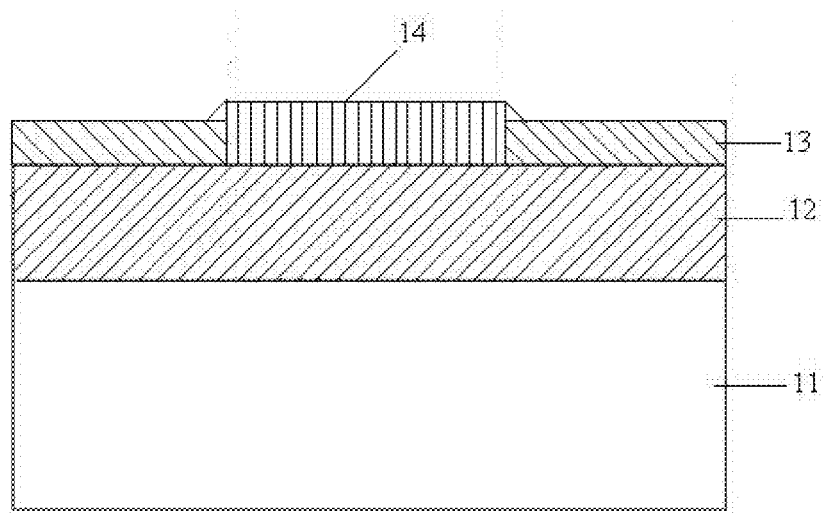
FIG. 1 is a structurally schematic view illustrating an organic thin film transistor in conventional technology.

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

Hereinafter, an organic thin film transistor and a method of manufacturing the organic thin film transistor provided by embodiments of the invention will be described in detail in conjunction with accompanying drawings.

According to an embodiment of the present invention, there is provided an organic thin film transistor, comprising: a substrate; and a gate electrode layer and a source/drain electrode layer formed on the substrate; wherein, between source and drain electrodes of the source/drain electrode layer, there is formed an organic semiconductor layer; and between the gate electrode layer and the organic semiconductor layer, there is further formed an organic insulating layer made from an organic polymer material.

According to an embodiment of the invention, there is provided an organic thin film transistor, in which an organic insulating layer made of an organic polymer material is disposed between a gate electrode layer and an organic semiconductor layer. Compared to an insulating layer made of a silicon oxide material, the surface energy of the organic insulating layer made of the organic polymer material is more similar to that of a source/drain electrode layer. As a result, difference in crystallizing property caused by printing the organic semiconductor material on the surface of source/drain electrode layer and on the surface of an insulating layer in conventional technology is ameliorated, and the problem of discontinuity in property between a thin film formed by printing the organic semiconductor material in an interior of a channel between source and drain electrodes and a thin film formed by printing the organic semiconductor material in a local and transitional regions from the channel to the source and drain electrodes can be solved. Thus, the hysteresis phenomenon presents in output characteristics of an organic thin film transistor is eliminated, and continually printing the organic thin film transistor on a large scale will be achieved.

In terms of their configuration, organic thin film transistors can be classified into a top-gate configuration and a bottom-gate configuration according to different positions of a gate electrode, and these two configurations can further be subdivided into four classes of a bottom-gate bottom-contact configuration, a bottom-gate top-contact configuration, a top-gate bottom-contact configuration and a top-gate top-contact configuration. Because the organic semiconductor in a bottom-gate bottom-contact organic thin film transistor is formed in the last step, an obtained organic semiconductor thin film is not prone to be damaged in subsequent manufacturing processes. On the contrary, in a bottom-gate top-contact organic thin film transistor, source and drain electrodes need to be fabricated on a relatively fragile organic semiconductor, and thus, a micro etching process with a high precision can not be used, instead, the source and drain electrodes can only be formed through a mask, which results in a great reduction in resolution of electrode pattern of the organic thin film transistor. Hence, an organic thin film transistor with the bottom-gate bottom-contact configuration fulfills the requirements of applications better. As examples, a bottom-gate bottom-contact organic thin film transistor illustrated in FIG. 2 and a bottom-gate top-contact organic thin film transistor illustrated in FIG. 3 will be described below, respectively.

Figure 2:
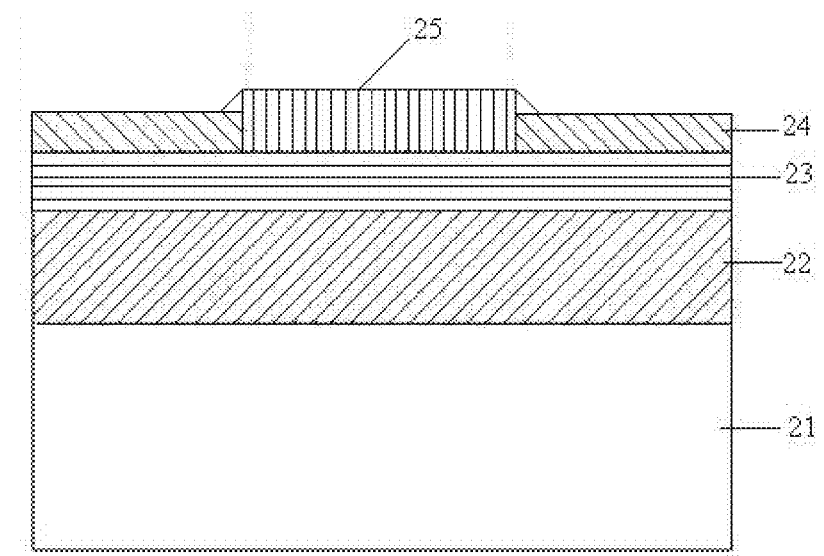
FIG. 2 is a schematic view illustrating an organic thin film transistor according to an embodiment of the invention.

As illustrated in FIG. 2, the bottom-gate bottom-contact organic thin film transistor comprises: a gate electrode layer 21, an insulating layer 22, an organic insulating layer 23, a source/drain electrode layer 24 and an organic semiconductor layer 25. The organic insulating layer 23 is formed by coating a solution which is prepared by dissolving poly(4-vinyl phenol) and methylated poly(melamine-co-formaldehyde) in propylene glycol monomethyl ether acetate.

It is to be noted that, in the course of forming the organic insulating layer by coating, poly(4-vinyl phenol) and methylated poly(melamine-co-formaldehyde) undergo a cross-linking reaction under heating condition to generate an organic macromolecular polymer, which has a repetitive unit of methylated poly(melamine-co-formaldehyde) cross-linked with poly(4-vinyl phenol) as illustrated in formula (I):

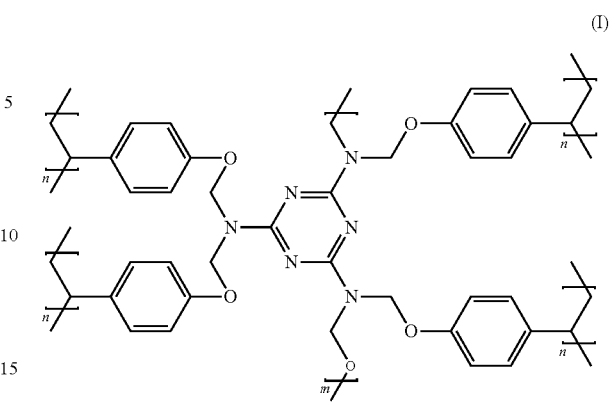

Wherein, m and n are positive integers and greater than or equal to 1, and upper limit values of m and n can be determined by the magnitude of molecular weights of the required materials. For example, m=3, and n=230.

In general, materials prepared by cross-linking of poly(4-vinyl phenol) and methylated poly(melamine-co-formaldehyde) may be collectively referred to as a PVP material. The main reason to select the above materials as an organic insulating layer is that, surface energy of the PVP material is similar to the surface energy possessed by a source/drain electrode layer, so that difference in crystallizing property caused by printing the organic semiconductor material on the surface of source/drain electrode layer and on the surface of an insulating layer in conventional technology is ameliorated. Thus, the hysteresis phenomenon presents in output characteristics of an organic thin film transistor is eliminated, and continually printing the organic thin film transistor on a large scale will be achieved.

In other embodiment of the invention, if electrically insulating property of an organic insulating layer is good enough, then the organic insulating layer made from an organic polymer material may also be directly used as a gate insulating layer. Namely, it is unnecessary to fabricate an insulating layer on a gate electrode layer further.

A sum of masses of poly(4-vinyl phenol) and methylated poly(melamine-co-formaldehyde) in the above solution for fabrication of the PVP material takes a percentage ranging from 5% to 15% in the total mass, and the mass ratio of poly(4-vinyl phenol) to methylated poly(melamine-co-formaldehyde) is less than 5 and greater than 1. Preferably, poly(4-vinyl phenol), methylated poly(melamine-co-formaldehyde) and propylene glycol monomethyl ether acetate are prepared in a mass ratio of 6:4:90. As regards an organic insulating layer that is made from a PVP material by dispensing in this ratio, it may has a more similar surface energy to a source/drain electrode layer, so that difference in crystallizing property caused by printing the organic semiconductor material on the surface of source/drain electrode layer and on the surface of an insulating layer in conventional technology is ameliorated. Thus, the hysteresis phenomenon presents in output characteristics of an organic thin film transistor is eliminated, and continually printing the organic thin film transistor on a large scale will be achieved.

Figure 3:
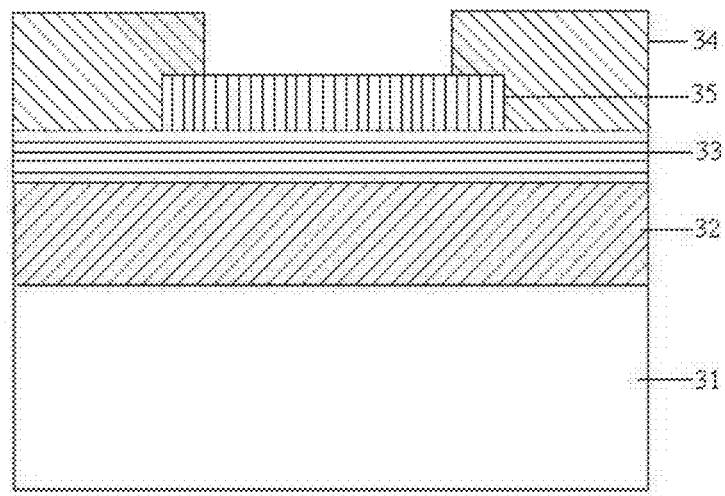
FIG. 3 is a schematic view illustrating another organic thin film transistor according to an embodiment of the invention.

An embodiment illustrated in FIG. 3 is a variant of the embodiment illustrated in FIG. 2, and it differs from the embodiment illustrated in FIG. 2 mainly in the configuration of the thin film transistor. As illustrated in FIG. 3, the bottom-gate top-contact organic thin film transistor comprises: a gate electrode layer 31, an insulating layer 32, an organic insulating layer 33, a source/drain electrode layer 34 and an organic semiconductor layer 35. The fabricating method of the organic insulating layer 33 is the same as the fabricating method of the organic insulating layer 23 in the embodiment illustrated in FIG. 2.

As can be seen from FIG. 2 and FIG. 3, in the organic thin film transistor according to embodiments of the invention, at least a part of the organic semiconductor layer directly contacts the organic insulating layer. For example, at least the part of the organic semiconductor layer for forming the channel directly contacts the organic insulating layer.

According to an embodiment of the invention, there is further provided a method of manufacturing an organic thin film transistor, comprising: an organic insulating layer made from an organic polymer material is formed on a substrate on which a gate electrode layer is formed; a source/drain electrode layer and an organic semiconductor layer are formed on the substrate on which the organic insulating layer is formed.

Such a method of manufacturing the organic thin film transistor provided by the embodiment of the invention is to fabricate an organic insulating layer made from the organic polymer material between the gate electrode layer and the organic semiconductor layer. Relative to an insulating layer formed from a silicon oxide material, surface energy of the organic insulating layer formed from the organic polymer material and surface energy of a source/drain electrode layer have better similarity. As a result, difference in crystallizing property caused by printing the organic semiconductor material on the surface of source/drain electrode layer and on the surface of an insulating layer in conventional technology is ameliorated, and the problem of discontinuity in property between a thin film formed by printing the organic semiconductor material in an interior of a channel between source and drain electrodes and a thin film formed by printing the organic semiconductor material in a local and transitional regions from the channel to the source and drain electrodes can be solved. Thus, the hysteresis phenomenon presenting in output characteristics of an organic thin film transistor is eliminated, and continually printing the organic thin film transistor on a large scale will be achieved.

For example, the method of manufacturing the organic thin film transistor provided by the embodiment of the invention may comprise the following steps:

Step 1, a gate electrode layer is formed on a substrate;

An existing method may be used to form the gate electrode layer on the substrate, and details are omitted here.

Step 2, an insulating layer is formed on the substrate on which the gate electrode layer is formed;

The insulating layer is made from a silicon oxide material. At the time of fabricating an insulating base (i.e. the insulating layer) on the substrate: firstly, a silicon oxide slice is immersed in a mixed solution of concentrated sulfuric acid and hydrogen peroxide in a volume ratio of 7:3, until bubbles attached to a surface of the silicon oxide slice disappear and organic pollution on the surface of the silicon oxide slice is removed, and then, the substrate is cleaned by ultraviolet-ozone for 30 minutes. In order to speed up the removal of organic pollution from the surface of the silicon oxide slice, the mixed solution of concentrated sulfuric acid and hydrogen peroxide may be placed on a hot stage at 90° C.

Step 3, an organic insulating layer is formed on the substrate on which the gate electrode layer and the insulating layer are formed;

The organic insulating layer may be made from an organic polymer material. Fabrication of a second insulating base (i.e. the organic insulating layer) may be carried out in accordance with the following steps: firstly, organic polymer material such as poly(4-vinyl phenol) and methylated poly(melamine-co-formaldehyde) are dissolved in propylene glycol monomethyl ether acetate, so as to prepare a solution of the organic polymer material; next, the prepared solution of the organic polymer material are coated on the substrate on which the gate electrode layer and the inorganic insulating layer are formed; and afterwards, the substrate on which the solution of the organic polymer material is coated is placed in a vacuum drying box for thermal treatment, thus, the second insulating base is formed. It is to be noted that, in the course of forming the second insulating base by coating, poly(4-vinyl phenol) and methylated poly(melamine-co-formaldehyde) undergo an organic cross-linking reaction under heating condition to generate an organic macromolecular polymer, which has a repetitive unit of methylated poly(melamine-co-formaldehyde) cross-linked with poly(4-vinyl phenol) as illustrated in formula (I):

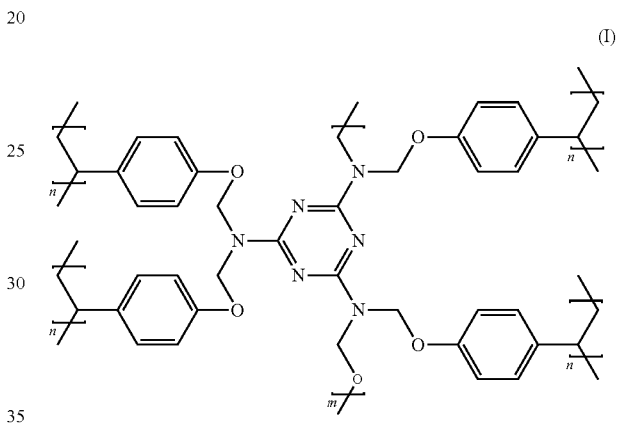

For choice, at the time of preparing the solution of the organic polymer material, a sum of masses of poly(4-vinyl phenol) and methylated poly(melamine-co-formaldehyde) in the solution of the organic polymer material takes a percentage ranging from 5% to 15% in the total mass of the solution, and the mass ratio of poly(4-vinyl phenol) to methylated poly(melamine-co-formaldehyde) is less than 5 and greater than 1. Preferably, the solution is made by maxing poly(4-vinyl phenol), methylated poly(melamine-co-formaldehyde) and propylene glycol monomethyl ether acetate in a mass ratio of 6:4:90.

At the time of coating the solution of the organic polymer material on the substrate on which the gate electrode layer and the inorganic insulating layer are formed, the solution of the organic polymer material is coated on the substrate on which the gate electrode layer and the inorganic insulating layer by way of a low speed spin-coating followed by a high speed spin-coating. For choice, the low speed spin-coating is a spin-coating at a speed of 800 revolutions per minute for 8 seconds, and the high speed spin-coating is a spin-coating at a speed of 4000 revolutions per minute for 40 seconds. Thus, the solution of the organic polymer material can be spin-coated on the substrate more evenly.

For choice, at the time of performing thermal treatment in the vacuum drying box, the thermal treatment condition for the substrate on which the solution of organic polymer material is coated is 90 minutes for heat treatment and at a temperature of 180° C. Of course, appropriate adjustments can also be made to the temperature and the time of the thermal treatment based on thickness of the coated organic solution, and embodiments of the invention will not set a limit to this.

Step 4, an organic semiconductor material is ink-jet printed on the substrate on which the gate electrode layer, the insulating layer and the organic insulating layer are formed, so as to form an organic semiconductor layer.

This step comprises two aspects: the first is to prepare organic semiconductor material; and the second is to ink-jet print the organic semiconductor material.

The organic semiconductor material to be ink-jet printed adopts o-dichlorobenzene as solvent. This solvent is mixed with a solute of organic semiconductor material TIPS-pentacene in a weight ratio of 1:0.02 to obtain a mixed solution, and afterwards, the mixed solution is placed on a hot stage at a temperature from 40° C. to 45° C. and heated for 20 minutes, it is ready for future use until the solute is completely dissolved.

In the course of ink-jet printing the organic semiconductor material, number of nozzles, dot spacing and one-way line spacing can be set, preferably, the number of nozzles is set as three, the dot spacing is set as 20 micrometers, and the one-way line spacing is set as 100 micrometers. Printing is conducted after setting is accomplished, and the obtained organic thin film transistor is placed in a vacuum drying box to undergo a thermal treatment at a temperature of 60° C. for 20 minutes.

Step 5, a source/drain electrode layer is fabricated on the substrate on which the gate electrode layer, the insulating layer, the organic insulating layer and the organic semiconductor layer are formed.

The source/drain electrode layer may be formed by using an existing method, in which, a mask having a pattern of the source/drain electrode layer is aligned with a pattern that has been formed on the organic semiconductor layer in accordance with structural requirements of an organic thin film transistor, and placed against the organic semiconductor layer tightly. Gold is deposited on a region not shielded by the mask by way of vacuum evaporation so as to form source and drain electrodes, and next, the substrate is placed in a vacuum drying box for 12 hours, then an organic thin film transistor is obtained. The organic thin film transistor has a bottom-gate top-contact configuration.

Figure 4:
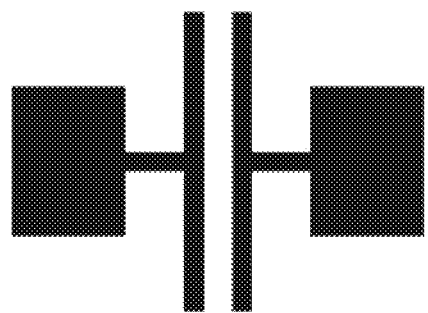
FIG. 4 is a schematic view illustrating two kinds of source and drain electrodes differing in size in an embodiment of the invention.
Figure 4:
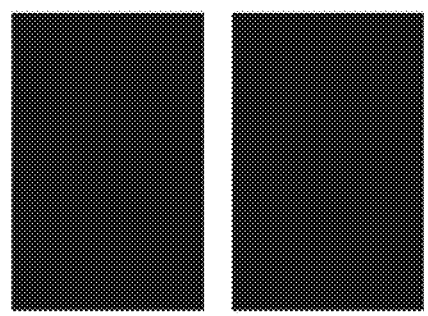
Figure 5:
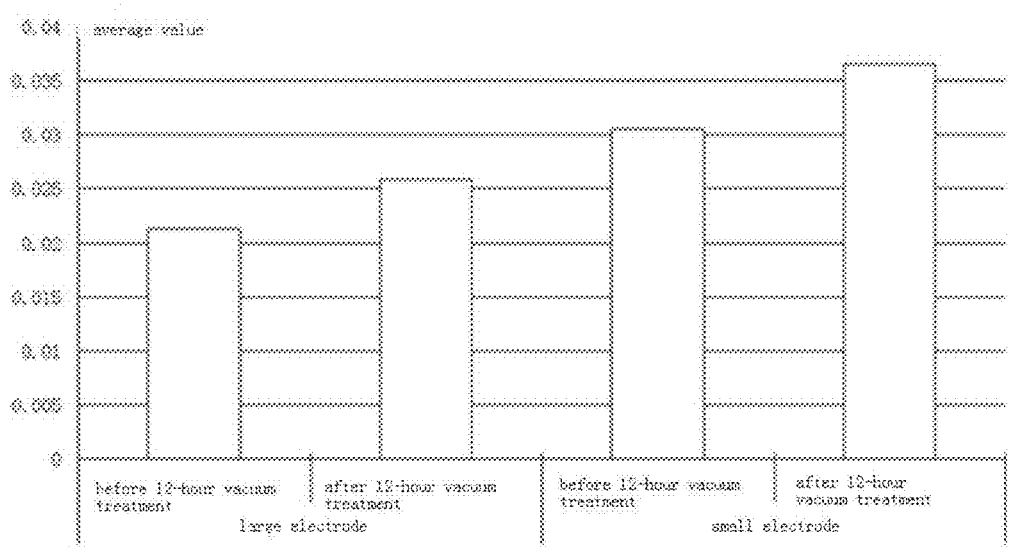
FIG. 5 is statistical chart illustrating the field-effect mobility for a bottom-gate top-contact organic thin film transistor fabricated by using electrodes differing in size illustrated in FIG. 4 after and before 12-hour vacuum treatment according to an embodiment of the invention.

The source and drain electrodes may be designed as small electrodes or large electrodes, as illustrated in FIG. 4, located in the upper part of the figure are the small electrodes, and located in the lower part are the large electrodes. The small electrodes and the large electrodes mainly differ in that: in a small-electrode organic thin film transistor, the contact area between an organic semiconductor layer and an organic insulating layer is larger than the contact area between the organic semiconductor layer and source and drain electrodes. As illustrated in FIG. 4, after the organic thin film transistors with two different size electrodes (but the size of a channel between the small electrodes is the same as that between the large electrodes) are placed in a vacuum drying box for 12 hours, both of them is promoted in their performances, moreover, the organic thin film transistor with small electrodes is superior to the organic thin film transistor with large electrodes in performance, it means that recrystallization occurs to an organic semiconductor thin film under vacuum condition because of a uniform interface between the organic insulating layer and the organic semiconductor layer. By comparing the cases before and after an organic insulating layer thin film is spin-coated, it can be found in an atomic force micrograph that the roughness of a base (before the organic insulating layer thin film is spin-coated, the base refers to an insulating layer; and after the organic insulating layer thin film is coated, the base refers to the organic insulating layer) is decreased from 0.5-0.6 nm (roughness of the insulating layer) to 0.3-0.4 nm (roughness of the organic insulating layer). A lower roughness is in favor of forming a high-quality interface between the organic semiconductor layer and the organic insulating layer. Therefore, in terms of structural design for organic semiconductor, an area ratio of interface between the organic semiconductor layer and the smooth-surface organic insulating layer to the interfaces between the organic semiconductor layer and source and drain electrodes can be raised by means of using small electrodes. Consequently, this facilitates to enhance the performance of the organic thin film transistor.

It is to be noted that, in other embodiment of the invention, if electrically insulating property of an organic insulating layer is good enough, then the organic insulating layer made from an organic polymer material may also be directly used as a gate insulating layer. Namely, it is unnecessary to fabricate an insulating layer on a gate electrode layer further. Hence, the step 2 in the above embodiment can be omitted.

As a variant of the above method of manufacturing the bottom-gate top-contact organic thin film transistor, a method of manufacturing a bottom-gate bottom-contact organic thin film transistor is further provided by an embodiment of the invention. Specifically, the step 4 and the step 5 in the above method are interchanged. For choice, other step(s) may further be arranged between the interchanged step 4 and step 5. For example, in an embodiment of the invention, after a source/drain electrode layer is fabricated and before an organic semiconductor material is ink-jet printed, the method of manufacturing the bottom-gate bottom-contact organic thin film transistor may further comprise the following step:

A surface of the source/drain electrode layer is treated with pentafluorothiophenol.

For choice, for treating the surface of the source/drain electrode layer with pentafluorothiophenol, there may be three methods, including:

(1) A dry self-assembled monomolecular technique, in which 0.1 ml of pentafluorothiophenol is dropped into a dryer, and the substrate on which the source/drain electrode layer is fabricated is placed in the dryer, sealed and laid aside for 12 hours; or (2) A wet self-assembled monomolecular technique, in which methylbenzene is used as a solvent, methylbenzene and pentafluorothiophenol are mixed in a volume ratio of 75:0.1, and the substrate on which the source/drain electrode layer is fabricated is immersed into the solution of pentafluorothiophenol for half an hour and taken out, rinsed with ethanol, dried by rotation, and placed on a hot stage at 100° C., and heated for 10-20 minutes; or (3) An inkjet-printing patterning surface treatment process, in which a solution of pentafluorothiophenol is sprayed onto gold electrodes (i.e., surfaces of the source and drain electrodes is plated with gold), and the solvent volatilizes slowly to be not left, so as to leave a monomolecular layer of the surface treating agent on the surface of the source/drain electrode layer.

Figure 6:
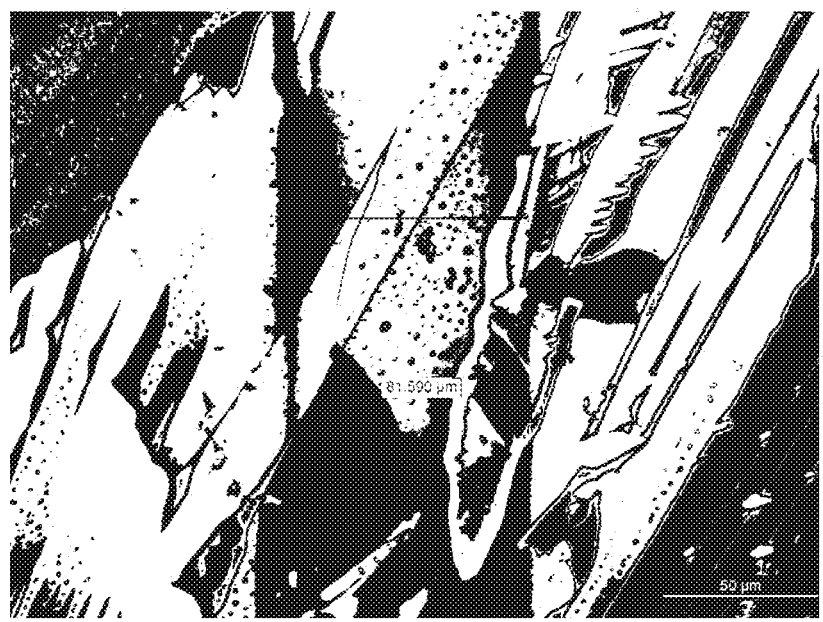
FIG. 6 is a high magnified polarized light micrograph showing a channel region of a bottom-gate bottom-contact organic thin film transistor according to an embodiment of the invention.
Figure 7:
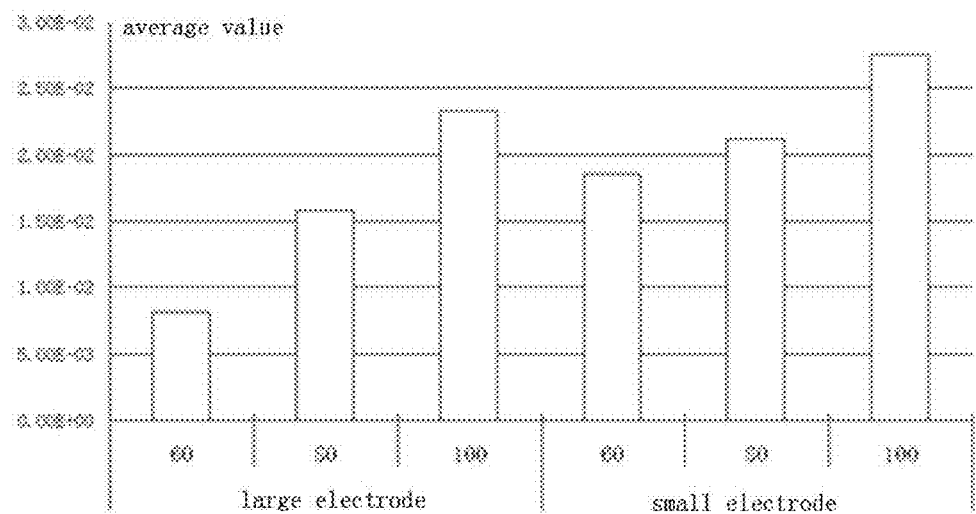
FIG. 7 is statistical chart illustrating the field-elect mobility for a bottom-gate bottom-contact organic thin film transistor fabricated by using the electrodes differing in size illustrated in FIG. 4 and having different channel lengths according to an embodiment of the invention.

According to the method of manufacturing the bottom-gate bottom-contact organic thin film transistor provided by the embodiment of the invention, as illustrated in FIG. 6, a channel region is magnified with a high magnified polarized light microscope, it can be found that, the manufactured bottom-gate bottom-contact organic thin film transistor is continuous on the boundary of the channel. Furthermore, the bottom-gate bottom-contact organic thin film transistors in which the source and drain electrodes are respectively in the form of two different electrodes in size are compared after placing in a vacuum drying box for 12 hours, as illustrated in FIG. 7, a bottom-gate bottom-contact organic thin film transistor with smaller electrodes and a larger channel length shows a higher field effect mobility. This also demonstrates that size of an interface between the organic semiconductor and the insulating layer makes a significant impact on performance of the organic thin film transistor.

Figure 8:
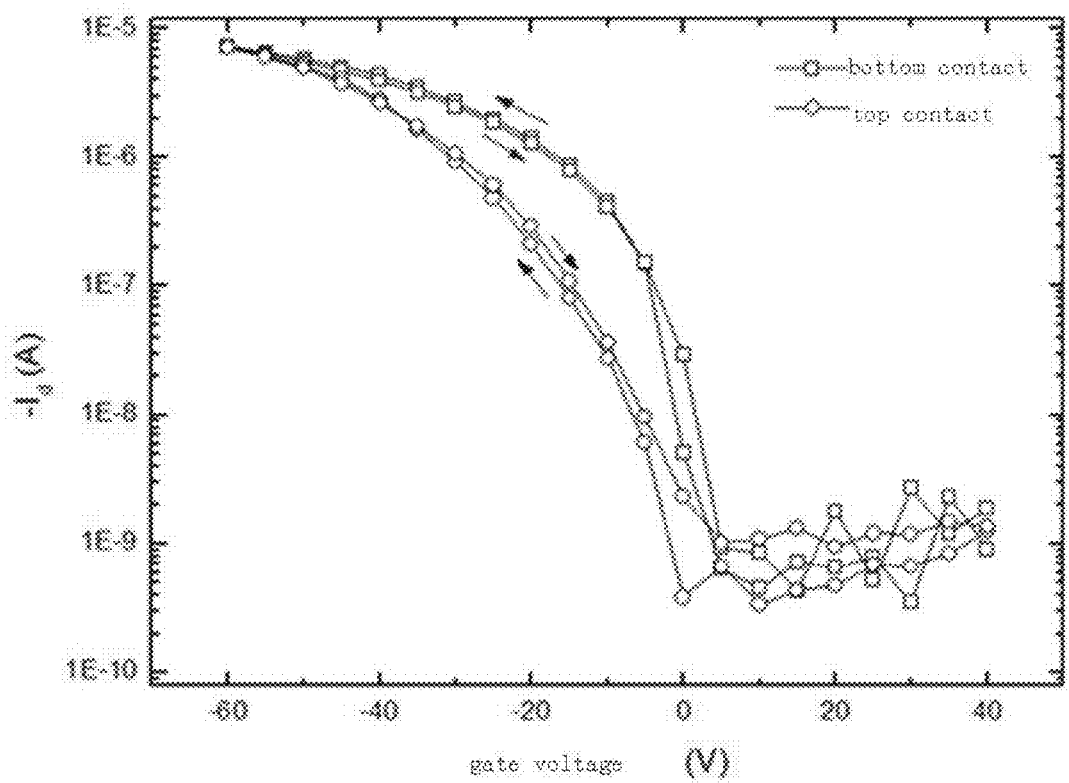
FIG. 8 is a comparative graph showing the transmission characteristics of a bottom-gate bottom-contact organic thin film transistor and a corresponding bottom-gate top-contact device according to an embodiment of the invention.

In addition, transmission characteristics of the bottom-gate bottom-contact organic thin film transistor and the corresponding bottom-gate top-contact organic thin film transistor are also compared, because the bottom-gate organic thin film transistor is a common choice in terms of organic electronics, and moreover, the bottom-gate top-contact organic thin film transistor is more prominent in performance, whereas in the bottom-gate bottom-contact electrode configuration, there are two kinds of mediums, i.e., a gate insulating layer and source and drain metal electrodes, on its substrate before fabrication of an organic thin film by printing, thus, the performances of the thin films grown on two different mediums are not the same, so that the performance of whole transistor will be affected. However, with the method of manufacturing an organic thin film transistor provided by embodiments of the invention, by comparing transmission characteristics of the bottom-gate bottom-contact organic thin film transistor and the corresponding bottom-gate top-contact organic thin film transistor, it is found in FIG. 8 that, performance indexes such as mobility, on/off ratio and so on of the two are similar to each other, and compared to the bottom-gate top-contact device, the bottom-gate bottom-contact device has a smaller sub-threshold swing, and such a problem existing in a bottom-gate bottom-contact organic thin film transistor that a thin film is discontinuous in a channel region is overcome by using a selective surface modification technology, so that a high mobility is achieved and the switching speed of the organic thin film transistor is increased.

What are described above is related to the illustrative embodiments of the disclosure only and not limitative to the scope of the disclosure; the scopes of the disclosure are defined by the accompanying claims.

What is claimed is:

1. A method of manufacturing an organic thin film transistor, comprising:
    forming an organic insulating layer made from an organic polymer material on a substrate on which a gate electrode layer is formed; and
    forming a source/drain electrode layer and an organic semiconductor layer on the substrate on which the organic insulating layer is formed,
    wherein forming the organic insulating layer made from the organic polymer material on the substrate on which the gate electrode layer is formed comprises:
    preparing a solution of the organic polymer material;
    coating the prepared solution of the organic polymer material on the substrate on which the gate electrode layer is formed, so as to form the organic insulating layer; or the following steps:
    forming an inorganic insulating layer on the substrate on which the gate electrode layer is formed;
    preparing a solution of the organic polymer material;
    coating the prepared solution of the organic polymer solution on the substrate on which the gate electrode layer and the inorganic insulating layer are formed, so as to form the organic insulating layer;
    wherein preparing the solution of the organic polymer material comprises:
    dissolving poly(4-vinyl phenol) and methylated poly (melamine-co-formaldehyde) in propylene glycol monomethyl ether acetate, so as to prepare the solution of the organic polymer material by mixing;
    coating the prepared solution of the organic polymer material to form the organic insulating layer comprises:
    allowing poly(4-vinyl phenol) and methylated poly (melamine-co-formaldehyde) to undergo an organic cross-linking reaction under heating condition, so as to form the organic insulating layer.

2. The method according to claim 1, wherein, poly(4-vinyl phenol) and methylated poly(melamine-co-formaldehyde) undergo a cross-linking reaction to generate an organic macromolecular polymer, which has a repetitive unit of methylated poly(melamine-co-formaldehyde) cross-linked with poly(4-vinyl phenol) as shown in formula (I):

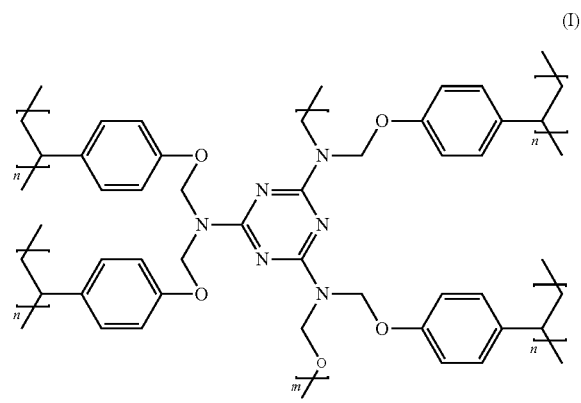

(I)

wherein m and n are positive integers and greater than or equal to 1.

3. The method according to claim 1, wherein, a sum of masses of poly(4-vinyl phenol) and methylated poly (melamine-co-formaldehyde) in the solution takes a percentage ranging from 5% to 15% in total mass of the solution, and a mass ratio of poly(4-vinyl phenol) to methylated poly (melamine-co-formaldehyde) is less than 5 and greater than 1.

4. The method according to claim 1, wherein, the solution is prepared by mixing poly(4-vinyl phenol), methylated poly (melamine-co-formaldehyde) and propylene glycol monomethyl ether acetate in a mass ratio of 6:4:90.

5. The method according to claim 1, wherein, the prepared solution of the organic polymer material is coated on the substrate on which the gate electrode layer is formed or on the substrate on which the gate electrode layer and the inorganic insulating layer are formed by way of a low speed spin-coating followed by a high speed spin-coating, the low speed spin-coating is a spin-coating at a speed of 800 revolutions per minute, and the high speed spin-coating is a spin-coating at a speed of 4000 revolutions per minute.

6. The method according to claim 1, wherein, after the prepared solution of the organic polymer material is coated on the substrate on which the gate electrode layer is formed or on the substrate on which the gate electrode layer and the inorganic insulating layer are formed,
    the substrate on which the solution of the organic polymer material is coated is placed in a vacuum drying box for thermal treatment, so that poly(4-vinyl phenol) and methylated poly(melamine-co-formaldehyde) undergo an organic cross-linking reaction under heating condition to form the organic insulating layer.

7. The method according to claim 6, wherein, the substrate coated with the solution of the organic polymer material is placed in the vacuum drying box at a heating temperature of 180° C.

* * * * *